(12) United States Patent
Goorden et al.

(10) Patent No.: US 10,788,766 B2
(45) Date of Patent: Sep. 29, 2020

(54) METROLOGY SENSOR, LITHOGRAPHIC APPARATUS AND METHOD FOR MANUFACTURING DEVICES

(71) Applicant: ASML Netherlands B.V., Veldhoven (NL)

(72) Inventors: Sebastianus Adrianus Goorden, Eindhoven (NL); Simon Reinald Huisman, Eindhoven (NL); Duygu Akbulut, Eindhoven (NL); Alessandro Polo, Arendonk (BE); Simon Gijsbert Josephus Mathijssen, Rosmalen (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/611,500

(22) PCT Filed: Mar. 6, 2018

(86) PCT No.: PCT/EP2018/055394
§ 371 (c)(1),
(2) Date: Nov. 7, 2019

(87) PCT Pub. No.: WO2018/206177
PCT Pub. Date: Nov. 15, 2018

(65) Prior Publication Data
US 2020/0103772 A1    Apr. 2, 2020

(30) Foreign Application Priority Data

May 8, 2017 (EP) .................................. 17169909

(51) Int. Cl.
*G03B 27/54* (2006.01)
*G03F 9/00* (2006.01)
(Continued)

(52) U.S. Cl.
CPC .......... *G03F 9/7084* (2013.01); *G01B 11/272* (2013.01); *G03F 7/70591* (2013.01)

(58) Field of Classification Search
CPC .. G03F 7/70591; G03F 9/7084; G01B 11/272
See application file for complete search history.

(56) References Cited

U.S. PATENT DOCUMENTS

| 5,072,126 A | 12/1991 | Progler |
| 6,961,116 B2 | 11/2005 | Den Boef et al. |

(Continued)

FOREIGN PATENT DOCUMENTS

| WO | WO 2013085389 A2 | 6/2013 |
| WO | WO 2014056708 A2 | 4/2014 |

(Continued)

OTHER PUBLICATIONS

Megens, et al. "Advances in Process Overlay Alignment Solutions for Future Technology Nodes", Metrology, Inspection, and Process Control for Microlithography XXI, SPIE vol. 6518, 65181Z, Apr. 2007; p. 65181Z-1-65181Z-12.

(Continued)

*Primary Examiner* — Peter B Kim
(74) *Attorney, Agent, or Firm* — Sterne, Kessler, Goldstein & Fox, P.L.L.C.

(57) ABSTRACT

Disclosed is a metrology sensor apparatus and associated method. The metrology sensor apparatus comprises an illumination system operable to illuminate a metrology mark on a substrate with illumination radiation having a first polarization state and an optical collection system configured to collect scattered radiation, following scattering of the illumination radiation by the metrology mark. The metrology mark comprises a main structure and changes, relative to the first polarization state, at least one of a polarization state of a first portion of the scattered radiation predominately (Continued)

resultant from scattering by the main structure and a polarization state of a second portion of radiation predominately resultant from scattering by one or more features other than the main structure, such that the polarization state of the first portion of the scattered radiation is different to the polarization state of the second portion of the scattered radiation. The metrology sensor apparatus further comprises an optical filtering system which filters out the second portion of the scattered radiation based on its polarization state.

19 Claims, 7 Drawing Sheets

(51) Int. Cl.
  *G01B 11/27* (2006.01)
  *G03F 7/20* (2006.01)

(56) References Cited

U.S. PATENT DOCUMENTS

| | | |
|---|---|---|
| 7,330,261 B2 | 2/2008 | Van Haren et al. |
| 2004/0033426 A1 | 2/2004 | Den Boef et al. |
| 2009/0195768 A1 | 8/2009 | Bijnen et al. |
| 2009/0310113 A1 | 12/2009 | Musa et al. |
| 2012/0062863 A1 | 3/2012 | Bijnen et al. |
| 2015/0355554 A1 | 12/2015 | Mathijssen |

FOREIGN PATENT DOCUMENTS

| | | |
|---|---|---|
| WO | WO 2015051970 A1 | 4/2015 |
| WO | WO 2016015955 A1 | 2/2016 |

OTHER PUBLICATIONS

International Search Report and Written Opinion of the International Searching Authority directed to related International Patent Application No. PCT/EP2018/055394, dated Jul. 20, 2018; 11 pages.

International Preliminary Report on Patentability and Written Opinion of the International Searching Authority directed to related International Patent Application No. PCT/EP2018/055394, dated Nov. 12, 2019; 9 pages.

METROLOGY SENSOR, LITHOGRAPHIC APPARATUS AND METHOD FOR MANUFACTURING DEVICES

CROSS-REFERENCE TO RELATED APPLICATIONS

This application claims priority of EP application no. 17169909.3, which was filed on 8 May 2017 and which is incorporated herein its entirety by reference.

FIELD OF THE INVENTION

The present invention relates to methods and apparatus usable, for example, in the manufacture of devices by lithographic techniques, and to methods of manufacturing devices using lithographic techniques. The invention relates more particularly to metrology sensors and more specifically to position sensors and methods for determining the position of a mark on a substrate.

BACKGROUND ART

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of a die, one die, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. These target portions are commonly referred to as "fields".

In the manufacture of complex devices, typically many lithographic patterning steps are performed, thereby forming functional features in successive layers on the substrate. A critical aspect of performance of the lithographic apparatus is therefore the ability to place the applied pattern correctly and accurately in relation to features laid down (by the same apparatus or a different lithographic apparatus) in previous layers. For this purpose, the substrate is provided with one or more sets of alignment marks. Each mark is a structure whose position can be measured at a later time using a position sensor, typically an optical position sensor. The lithographic apparatus includes one or more alignment sensors by which positions of marks on a substrate can be measured accurately. Different types of marks and different types of alignment sensors are known from different manufacturers and different products of the same manufacturer. A type of sensor widely used in current lithographic apparatus is based on a self-referencing interferometer as described in U.S. Pat. No. 6,961,116 (den Boef et al). Generally marks are measured separately to obtain X- and Y-positions. However, combined X- and Y-measurement can be performed using the techniques described in published patent application US 2009/195768 A (Bijnen et al). Modifications and applications of such sensors are described in US2015355554A1 (Mathijssen), WO2015051970A1 (Tinnemans et al). The contents of all of these publications are incorporated herein by reference.

The application of new layers over the layer containing the alignment marks results in impairment of position signals obtained using the position sensor (or alignment sensor). This can be particularly problematic when at least one of the overlaying layers comprises an opaque material. An example of such a material is amorphous carbon. In order to accurately position device patterns in such a layer, one method may comprise cutting openings in the layer to reveal the underlying alignment marks. These windows can be relatively coarsely positioned, but the accuracy required still presupposes some method to determine the position of the underlying marks.

Cutting openings in this manner requires additional processing steps and expense. Therefore, another proposal is to use one or more longer wavelength of radiation (e.g., infra-red) that can penetrate the opaque layer. However, the wafer quality (WQ) for such a measurement may still be very low (e.g., $10^{-6}$). Wafer quality is a measure (ratio) of the actual alignment signal strength with reference to a signal generated by a fiducial mark. At such low wafer quality, surface scattering into the target diffraction orders, due to residual topography or roughness in the overlaying layer may cause alignment offsets. Additionally, background light due to zeroth order scattering and ghosting may limit the reproducibility.

SUMMARY OF THE INVENTION

The present invention in a first aspect aims to provide improved measurement accuracy at low wafer quality.

The invention in a first aspect provides a metrology sensor system comprising an illumination system operable to illuminate a metrology mark on a substrate with illumination radiation having a first polarization state; an optical collection system configured to collect scattered radiation, following scattering of said illumination radiation by said metrology mark, said metrology mark comprising a main structure and being operable to change, relative to said first polarization state, at least one of a polarization state of a first portion of the scattered radiation predominately resultant from scattering by said main structure and a polarization state of a second portion of radiation predominately resultant from scattering by one or more features other than said main structure, such that the polarization state of said first portion of the scattered radiation is different to the polarization state of said second portion of said scattered radiation; and an optical filtering system operable to substantially filter out said second portion of the scattered radiation based on its polarization state.

In an embodiment said second portion of the scattered radiation predominately comprises radiation having been scattered by at least one or more layers formed over the main structure.

In an embodiment said optical filtering system comprises at least a polarizing device operable to block said second portion of the scattered radiation based on its polarization state.

In an embodiment the metrology sensor apparatus comprises a first processing branch and a second processing branch, each for processing said scattered radiation, and said polarizing device comprises a polarizing beam splitter operable to direct at least some of said first portion of scattered radiation to said first processing branch and to direct said second portion of said scattered radiation to said second processing branch.

In an embodiment said optical filtering system further comprises at least one wave plate device operable to rotate the polarization state of at least some of the first portion of scattered radiation to a polarization state more suitable for processing.

In an embodiment said metrology mark is operable to change the polarization state of said first portion of the scattered radiation to a second polarization state, while not changing the polarization state of said second portion of the scattered radiation such that said second portion of the scattered radiation substantially retains said first polarization state. In a further embodiment said main structure comprises a periodic structure having a first pitch operable to diffract said illumination radiation, said periodic structure being sub-segmented with a second pitch operable to change the polarization state of said first portion of the scattered radiation.

In an embodiment said first polarization state is a first circular polarization state and said second polarization state is a second circular polarization state, said second circular polarization state being in the opposite direction as said first circular polarization state. In a further embodiment said optical filtering system comprises at least one quarter-wave plate for converting both the first portion of scattered radiation having said first circular polarization state and the second portion of scattered radiation having said second circular polarization state into mutually orthogonal linear polarization states, enabling their separation.

In an embodiment said first polarization state is a linear polarization state. In a further embodiment said optical filtering system is operable to pass only scattered radiation having a polarization state orthogonal to said first polarization state to a processing system.

In an embodiment said metrology mark is operable to change the polarization state of said first portion of the scattered radiation to a second polarization state, said second polarization state being orthogonal to said first polarization state.

In an embodiment the metrology sensor apparatus is a position sensor, further comprising at least one processing system and radiation detecting system.

In an embodiment said optical filtering system is operable to substantially not filter out said second portion of the scattered radiation in a first wavelength range at least partially corresponding to an illumination wavelength range used in a first positioning phase; and to filter out said second portion of the scattered radiation in a second wavelength range at least partially corresponding to an illumination wavelength range used in a second positioning phase.

In an embodiment said first positioning phase is a coarse positioning phase performed on a first metrology mark and said second positioning phase is a fine positioning phase performed on a second metrology mark, and wherein only said second metrology mark is operable to perform said change of polarization state.

The invention in a second aspect provides a method of measuring a metrology mark, comprising: illuminating a metrology mark on a substrate with illumination radiation having a first polarization state; collecting scattered radiation, following scattering of said illumination radiation by said metrology mark, said metrology mark comprising a main structure and being operable to change, relative to said first polarization state, at least one of a polarization state of a first portion of the scattered radiation predominately resultant from scattering by said main structure and a polarization state of a second portion of radiation predominately resultant from scattering by one or more features other than said main structure, such that the polarization state of said first portion of the scattered radiation is different to the polarization state of said second portion of said scattered radiation; and filtering out said second portion of the scattered radiation based on its polarization state.

In an embodiment said second portion of the scattered radiation predominately comprises radiation having been scattered by at least from one or more layers formed over the main structure.

In an embodiment the method further comprises using a polarizing beam splitter to perform said filtering; and processing at least some of said first portion of scattered radiation separately to processing of said second portion of scattered radiation.

In an embodiment the method further comprises rotating the polarization state of at least the first portion of scattered radiation to a polarization state more suitable for processing.

In an embodiment said metrology mark changes the polarization state of said first portion of the scattered radiation to a second polarization state, while not changing the polarization state of said second portion of the scattered radiation such that said second portion of the scattered radiation substantially retains said first polarization state.

In an embodiment said main structure comprises a periodic structure having a first pitch operable to diffract said illumination radiation, said periodic structure being sub-segmented with a second pitch operable to change the polarization state of said first portion of the scattered radiation.

In an embodiment said first polarization state is a first circular polarization state and said second polarization state is a second circular polarization state, said second circular polarization state being in the opposite direction as said first circular polarization state.

In an embodiment the method further comprises converting both the first portion of scattered radiation having said first circular polarization state and the second portion of scattered radiation having said second circular polarization state into mutually orthogonal linear polarization states, enabling their separation.

In an embodiment said first polarization state is a linear polarization state. In a further embodiment the method further comprises said filtering comprises passing only scattered radiation having a polarization state orthogonal to said first polarization state for processing.

In an embodiment the method further comprises said metrology mark is operable to change the polarization state of said first portion of the scattered radiation to a second polarization state, said second polarization state being orthogonal to said first polarization state In an embodiment said filtering step is not performed on said scattered radiation in a first wavelength range which at least partially corresponds to an illumination wavelength range used in a first positioning phase, but is performed on said scattered radiation in a second wavelength range at least partially corresponding to an illumination wavelength range used in a second positioning phase.

In an embodiment said first positioning phase is a coarse positioning phase performed on a first metrology mark and said second positioning phase is a fine positioning phase performed on a second metrology mark, and wherein only said second metrology mark is operable to change the polarization state of at least some of the scattered radiation.

The invention also provides for a method of manufacturing devices wherein a device pattern is applied to a substrate using a lithographic process, the method including positioning the applied pattern by reference to measured positions of one or more marks formed on the substrate, the measured positions being obtained using a metrology sensor system of the first aspect.

The invention also provides for a lithographic apparatus for use in applying a pattern to a substrate, the lithographic apparatus including a metrology sensor system of the first aspect.

The above and other aspects of the invention will be understood from a consideration of the examples described below.

BRIEF DESCRIPTION OF THE DRAWINGS

Embodiments of the invention will now be described, by way of example only, with reference to the accompanying drawings, in which.

DETAILED DESCRIPTION OF EMBODIMENTS

Before describing embodiments of the invention in detail, it is instructive to present an example environment in which embodiments of the present invention may be implemented.

Figure 1:
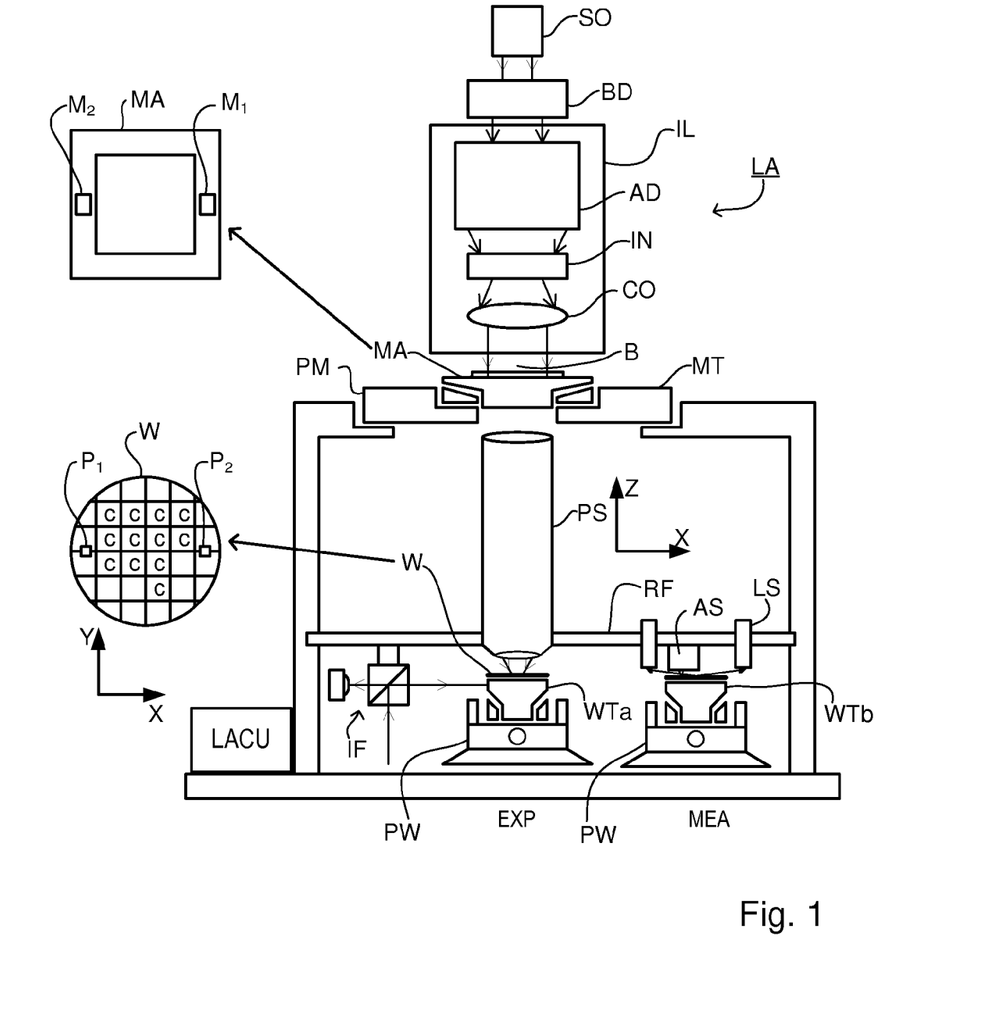
FIG. 1 depicts a lithographic apparatus.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; two substrate tables (e.g., a wafer table) WTa and WTb each constructed to hold a substrate (e.g., a resist coated wafer) W and each connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W. A reference frame RF connects the various components, and serves as a reference for setting and measuring positions of the patterning device and substrate and of features on them.

The illumination system may include various types of optical components, such as refractive, reflective, magnetic, electromagnetic, electrostatic or other types of optical components, or any combination thereof, for directing, shaping, or controlling radiation.

The patterning device support MT holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support MT may be a frame or a table, for example, which may be fixed or movable as required. The patterning device support may ensure that the patterning device is at a desired position, for example with respect to the projection system.

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

As here depicted, the apparatus is of a transmissive type (e.g., employing a transmissive patterning device). Alternatively, the apparatus may be of a reflective type (e.g., employing a programmable mirror array of a type as referred to above, or employing a reflective mask). Examples of patterning devices include masks, programmable mirror arrays, and programmable LCD panels. Any use of the terms "reticle" or "mask" herein may be considered synonymous with the more general term "patterning device." The term "patterning device" can also be interpreted as referring to a device storing in digital form pattern information for use in controlling such a programmable patterning device.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems.

In operation, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may for example include an adjuster AD for adjusting the angular intensity distribution of the radiation beam, an integrator IN and a condenser CO. The illuminator may be used to condition the radiation beam, to have a desired uniformity and intensity distribution in its cross section.

The radiation beam B is incident on the patterning device MA, which is held on the patterning device support MT, and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa or WTb can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment marks may also be included within dies, in amongst the device features, in which case it is desirable that the markers be as small as possible and not require any different imaging or process conditions than adjacent features. The alignment system, which detects the alignment markers is described further below.

The depicted apparatus could be used in a variety of modes. In a scan mode, the patterning device support (e.g., mask table) MT and the substrate table WT are scanned synchronously while a pattern imparted to the radiation beam is projected onto a target portion C (i.e., a single dynamic exposure). The speed and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WT is moved or scanned.

Combinations and/or variations on the above described modes of use or entirely different modes of use may also be employed.

Lithographic apparatus LA is of a so-called dual stage type which has two substrate tables WTa, WTb and two stations—an exposure station EXP and a measurement station MEA—between which the substrate tables can be exchanged. While one substrate on one substrate table is being exposed at the exposure station, another substrate can be loaded onto the other substrate table at the measurement station and various preparatory steps carried out. This enables a substantial increase in the throughput of the apparatus. The preparatory steps may include mapping the surface height contours of the substrate using a level sensor LS and measuring the position of alignment markers on the substrate using an alignment sensor AS. If the position sensor IF is not capable of measuring the position of the substrate table while it is at the measurement station as well as at the exposure station, a second position sensor may be provided to enable the positions of the substrate table to be tracked at both stations, relative to reference frame RF. Other arrangements are known and usable instead of the dual-stage arrangement shown. For example, other lithographic apparatuses are known in which a substrate table and a measurement table are provided. These are docked together when performing preparatory measurements, and then undocked while the substrate table undergoes exposure.

Figure 2:
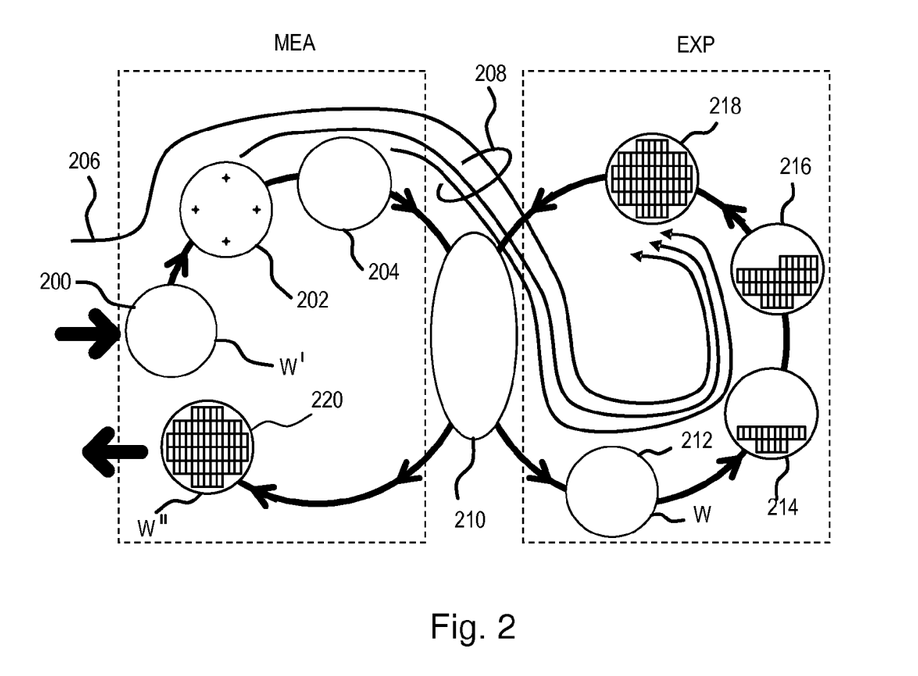
FIG. 2 illustrates schematically measurement and exposure processes in the apparatus of FIG. 1.

FIG. 2 illustrates the steps to expose target portions (e.g. dies) on a substrate W in the dual stage apparatus of FIG. 1. On the left hand side, within a dotted box, steps are performed at a measurement station MEA, while the right hand side shows steps performed at the exposure station EXP. From time to time, one of the substrate tables WTa, WTb will be at the exposure station, while the other is at the measurement station, as described above. For the purposes of this description, it is assumed that a substrate W has already been loaded into the exposure station. At step 200, a new substrate W' is loaded to the apparatus by a mechanism not shown. These two substrates are processed in parallel in order to increase the throughput of the lithographic apparatus.

Referring initially to the newly-loaded substrate W', this may be a previously unprocessed substrate, prepared with a new photo resist for first time exposure in the apparatus. In general, however, the lithography process described will be merely one step in a series of exposure and processing steps, so that substrate W' has been through this apparatus and/or other lithography apparatuses, several times already, and may have subsequent processes to undergo as well. Particularly for the problem of improving overlay performance, the task is to ensure that new patterns are applied in exactly the correct position on a substrate that has already been subjected to one or more cycles of patterning and processing. These processing steps progressively introduce distortions in the substrate that must be measured and corrected for, to achieve satisfactory overlay performance.

The previous and/or subsequent patterning step may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

At 202, alignment measurements using the substrate marks P1 etc. and image sensors (not shown) are used to measure and record alignment of the substrate relative to substrate table WTa/WTb. In addition, several alignment marks across the substrate W' will be measured using alignment sensor AS. These measurements are used in one embodiment to establish a "wafer grid", which maps very accurately the distribution of marks across the substrate, including any distortion relative to a nominal rectangular grid.

At step 204, a map of wafer height (Z) against X-Y position is measured also using the level sensor LS. Conventionally, the height map is used only to achieve accurate focusing of the exposed pattern. It may be used for other purposes in addition.

When substrate W' was loaded, recipe data 206 were received, defining the exposures to be performed, and also properties of the wafer and the patterns previously made and to be made upon it. To these recipe data are added the measurements of wafer position, wafer grid and height map that were made at 202, 204, so that a complete set of recipe and measurement data 208 can be passed to the exposure station EXP. The measurements of alignment data for example comprise X and Y positions of alignment targets formed in a fixed or nominally fixed relationship to the product patterns that are the product of the lithographic process. These alignment data, taken just before exposure, are used to generate an alignment model with parameters that fit the model to the data. These parameters and the alignment model will be used during the exposure operation to correct positions of patterns applied in the current lithographic step. The model in use interpolates positional deviations between the measured positions. A conventional alignment model might comprise four, five or six parameters, together defining translation, rotation and scaling of the 'ideal' grid, in different dimensions. Advanced models are known that use more parameters.

At 210, wafers W' and W are swapped, so that the measured substrate W' becomes the substrate W entering the exposure station EXP. In the example apparatus of FIG. 1, this swapping is performed by exchanging the supports WTa and WTb within the apparatus, so that the substrates W, W' remain accurately clamped and positioned on those supports, to preserve relative alignment between the substrate tables and substrates themselves. Accordingly, once the tables have been swapped, determining the relative position between projection system PS and substrate table WTb (formerly WTa) is all that is necessary to make use of the measurement information 202, 204 for the substrate W (formerly W') in control of the exposure steps. At step 212, reticle alignment is performed using the mask alignment marks M1, M2. In steps 214, 216, 218, scanning motions and radiation pulses are applied at successive target locations across the substrate W, in order to complete the exposure of a number of patterns.

By using the alignment data and height map obtained at the measuring station in the performance of the exposure steps, these patterns are accurately aligned with respect to the desired locations, and, in particular, with respect to features previously laid down on the same substrate. The exposed substrate, now labeled W" is unloaded from the apparatus at step 220, to undergo etching or other processes, in accordance with the exposed pattern.

The skilled person will know that the above description is a simplified overview of a number of very detailed steps involved in one example of a real manufacturing situation. For example rather than measuring alignment in a single pass, often there will be separate phases of coarse and fine measurement, using the same or different marks. The coarse and/or fine alignment measurement steps can be performed before or after the height measurement, or interleaved.

Presently, optical position sensors, such as alignment sensor AS, use visible and/or near-infra-red (NIR) radiation to read alignment marks. In some processes, processing of layers on the substrate after the alignment mark has been formed leads to situations in which the marks cannot be found by such an alignment sensor due to low or no signal strength. A low or zero signal strength can be caused for example by opaque layers on top of the marks which block radiation in the visible/NIR wavelength band, and therefore operation of the alignment sensor. To address this issue, it is known to produce additional marks in subsequent layers to facilitate mark detection. However, the production of these additional marks is expensive. Some processes rely on the production of an optical window on top of the existing marks, in such a way that only the material which is located on top of the marks is removed and therefore the marks can be measured. However, these also require additional processing steps and expense.

Figure 3:
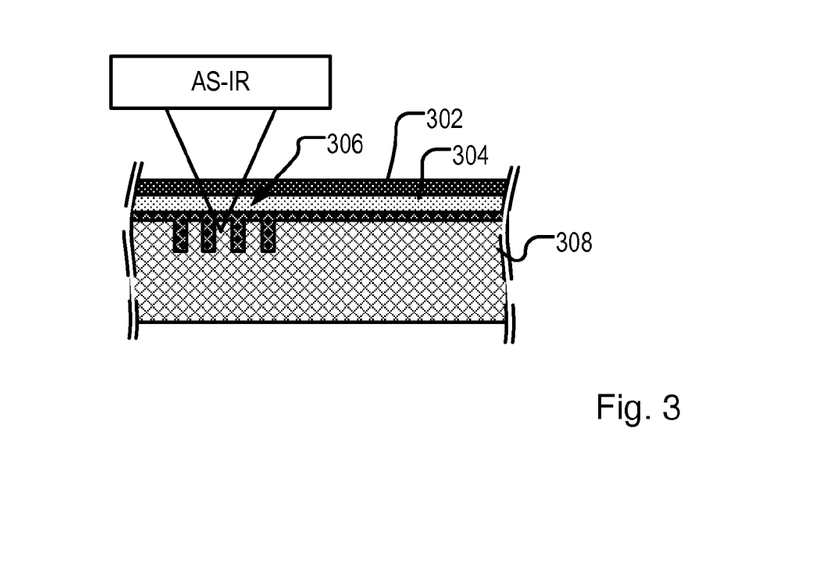
FIG. 3 illustrates schematically the use of a position sensor to measure the position of a target structure formed on a substrate, and a problem of an opaque overlying structure.

FIG. 3 illustrates an alternative solution, based on using an alignment sensor AS-IR which uses a much longer (than normally used) wavelength of radiation that can penetrate an opaque layer 302. The opaque layer 302 is formed over other material layers 304 and alignment mark 306 on substrate 308. Present alignment sensors currently operate at wavelengths between 500-900 nm. While this wavelength range includes infrared wavelengths near to the visible range, these are unable to penetrate common opaque layers. Transmission through such opaque layers is relatively high for longer IR wavelengths. To mitigate this, an alignment sensor AS-IR which can operate for example using radiation of wavelengths longer than 1000 nm, for example in the range between 1500-2500 nm, may be provided that will be transmitted to a greater extent through such opaque layers. The alignment mark 306 may be a conventional alignment mark, with conventional pitch or may be a special mark with, for example a longer grating pitch, which is better adapted to measurements with these longer wavelengths.

Figure 4:
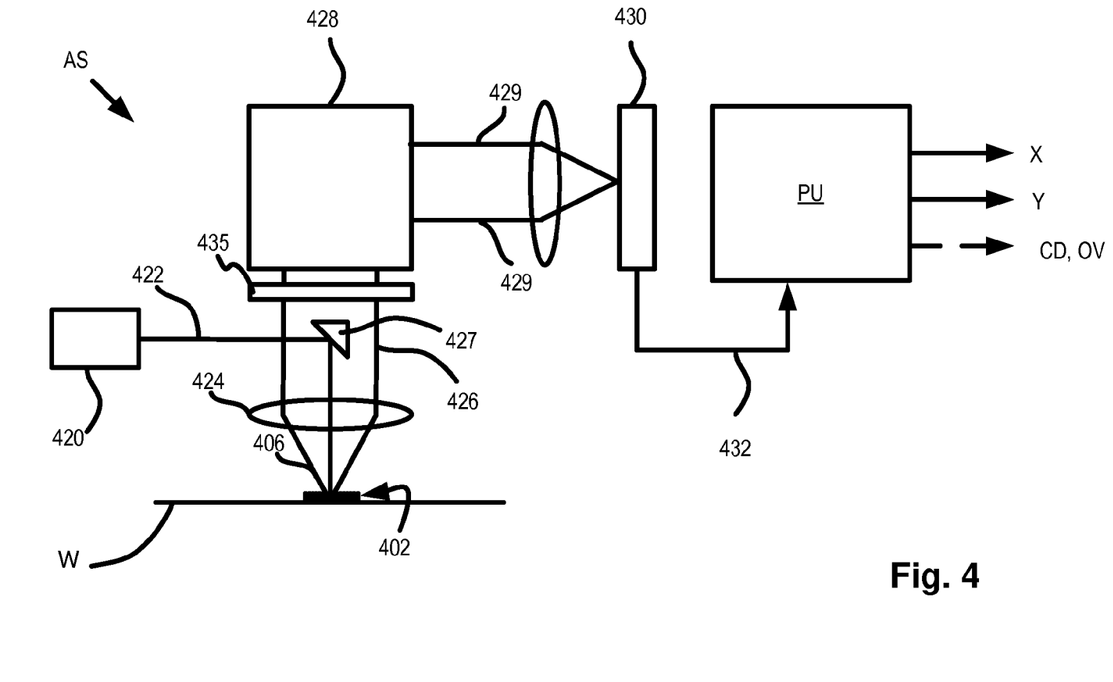
FIG. 4 illustrates schematically a position sensor adaptable according to an embodiment of the present invention.

A simplified, schematic drawing of an example of a position sensor or alignment sensor according to one example of the present disclosure is shown in FIG. 4. Illumination source 420 provides a beam 422 of radiation of one of more wavelengths, which is diverted through an objective lens 424 via a spot mirror 427 onto an alignment mark such as alignment mark 402, located on substrate W. Radiation scattered by alignment mark 402 is picked up by objective lens 424 and collimated into an information-carrying beam 426. An optical analyzer 428 processes beam 426 and outputs separate beams 429 onto a detection system (e.g., sensor array) 430 (e.g., via an optical fiber). Intensity signals 432 from individual sensors in detection system 430 are provided to a processing unit PU. By a combination of the optical processing in the system 428 and the computational processing in the unit PU, values for X- and Y-position on the substrate relative to the sensor are output. Alternatively, or in addition, other parameters may be measured such as overlay OV and/or critical dimension CD.

Detail of the construction and operation of such an alignment sensor can be found in the prior patent publications mentioned in the introduction, and will not be repeated here. Briefly, in the illumination path 422 there may be provided a plurality of individual wavelength sources such as LEDs or laser sources. The sources may be arranged to supply different wavelengths of radiation, for example one or more of green and red visible light, near infrared (NIR) wavelengths and/or infrared radiation in the range 1500-2500 nm, optionally including a wavelength having a wavelength longer than 2000 nm. Sources can include LEDs, lasers, gas discharge sources, plasma sources, supercontinuum sources and inverse Compton scattering sources.

Radiation 426 reflected and diffracted by the alignment mark 402 is collected by the objective lens 424. While the collected radiation 426 is illustrated as a single beam on the optical axis, this information carrying beam is actually spread out by scattering and diffraction. An axial component representing a noise signal is at least partially blocked by the spot mirror 427, which thus acts as an obscuration or obscuration for blocking this noise signal. The remaining higher order diffracted radiation (and some stray noise signal) then enters a processing system 428.

The nature of the processing system 428 will depend on the desired performance and the type of mark provided. The processing system 428 may be based on interferometry, or on imaging, or on a combination of techniques. The processing system 428 may be substantially the same type as one another, or they may be completely different types. In the present example, it will be assumed that the processing system is based on interferometry, and comprises a self-referencing interferometer of the type described in the references.

The processing system 428 may comprise a self-referencing interferometer which receives the collected radiation 426. At the entrance of the interferometer 428, a half-wave plate 435 conditions the polarization of the radiation to 45 degrees. The interferometer then processes it in the manner described in the references, interfering the beam with a rotated copy of itself so that opposite diffraction orders interfere constructively and destructively. A polarizing beam splitter separates "sum" and "difference" channels, which provide the position-sensitive optical signals 429 to a detection system 430. The detection system 430 may include, for each of the sum and difference channels, photodetectors for obtaining the desired electrical position signals 432. Where the waveband contains multiple wavelengths or wavelength ranges, then wavelength demultiplexers are included in the detection system, and individual photodetectors are provided to obtain an electrical signal 432 for each wavelength or wavelength range.

Due to the very low wafer quality when aligning through opaque layers, signal levels will be orders of magnitude lower than typical alignment sensor signal levels when aligning through transparent layers. Wafer quality is a measure (ratio) of the actual alignment signal strength with reference to a signal generated by a fiducial mark. A corresponding improvement in the suppression of a noise signal is therefore required to achieve acceptable alignment performance.

Figure 5:
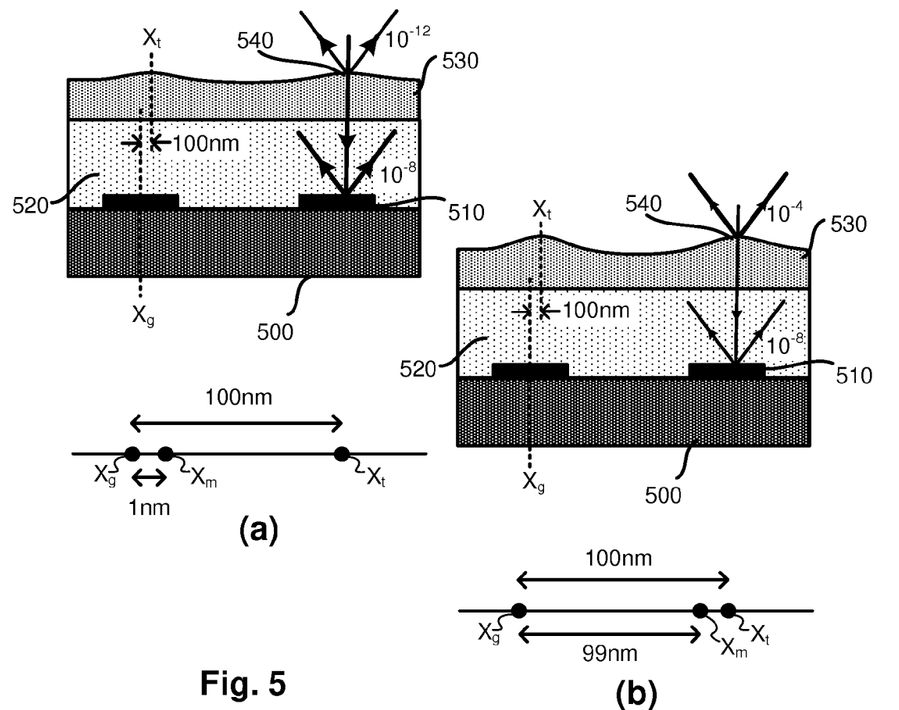
FIG. 5 schematically illustrates the problem of measuring an alignment mark through an overlaying layer with (a) a small surface topography and (b) a relatively larger surface topography.

FIG. 5 illustrates the problem. FIGS. 5(a) and 5(b) each show a first layer 500 comprising an alignment mark of which two individual features 510 (lines) are shown. On this first layer two additional layers are provided: a second layer 520 and a third layer 530. At least third layer 530 may be opaque, for example. It can be seen that the third layer 530 comprises a topography (roughness or unflatness). There are two main types of surface topography/roughness. A first of these is residual topography. This residual topography typically results from the deposition of material onto the underlying alignment grating without making the top layers perfectly flat. Because of this, residual topography will tend to have the same spatial (grating) structure as the underlying alignment grating. This residual topography will tend to only scatter radiation into the same directions as the alignment grating, e.g., into the +1st and −1st (and possibly higher) diffraction orders. This radiation typically interferes with/coherently adds to the radiation scattered by the alignment grating, assuming the temporal coherence length of the source is large compared to the stack thickness, which is typically the case. The other main type of surface topography is random surface roughness, which has many/all spatial frequency contributions. In this case, radiation is scattered into all parts of the pupil.

In FIG. 5, the illustrated topography peaks 540 comprise residual topography, although there will also be some random surface roughness present. Although not shown to scale, the topography height (height of the peaks 540 relative to the troughs) is for this example, 0.002 nm in FIG. 5(a) and 20 nm in FIG. 5(b). Also labelled is the position of an alignment mark (grating) feature (e.g., defining the center position of the grating) $X_g$, the position of a corresponding topography peak $X_t$ and the difference between these positions (in this example 100 nm). The alignment mark in such an arrangement may have a diffraction efficiency as low as of $10^{-8}$. However, the surface (residual) topography may also diffract the measurement beam, essentially acting as a grating. In the specific example shown, this residual topography "grating" may have a diffraction efficiency of $10^{-12}$ (FIG. 5(a)) or $10^{-4}$ (FIG. 5(b)).

Figure 6:
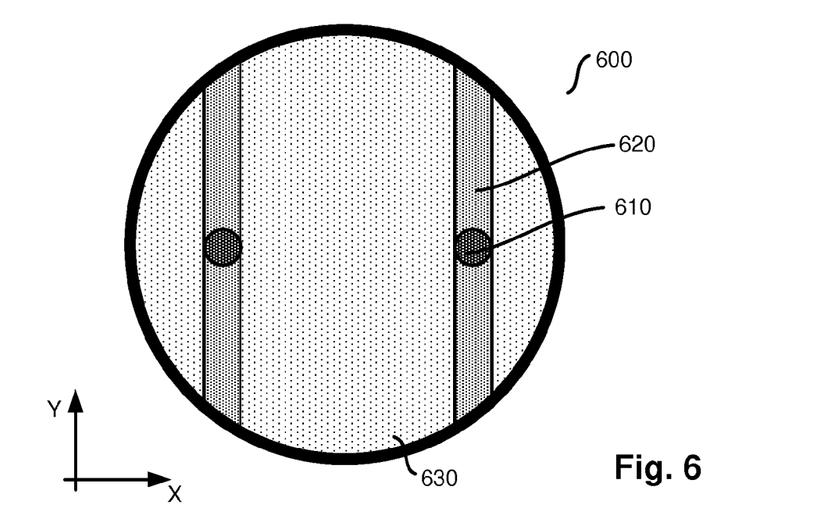
FIG. 6 illustrates the problem of low wafer quality on the measurement pupil.

FIG. 6 shows a typical measurement pupil 600 resulting from a measurement such as is illustrated in FIG. 5. Regions 610 correspond to the coherent +1$^{st}$ and −1$^{st}$ diffraction orders. The surface scattered radiation resultant from the residual topography travels in the same direction as the grating scattered radiation, i.e., into regions 610, as well as a portion of the radiation scattered by the random surface roughness. This radiation coherently adds to the alignment signal and causes positional (accuracy) errors which depend on one or more of: the position of the surface topography, the vertical distance between grating and roughness, wavelength, pitch, etc. Due to the coherent addition of this radiation to the alignment signal, the measured alignment position is very sensitive to this surface scattering.

The other pupil regions shown 620, 630 relate to radiation scattered by the random surface roughness to pupil regions other than those corresponding to the main diffraction orders. The portion of the surface scattered radiation scattered to region 630 adds a constant offset to the measured alignment signal. This degrades reproducibility of the alignment position, but does not cause an accuracy (bias) problem. The radiation going into region 630 is spatially separated from the alignment signal and therefore relatively easy to eliminate, for example by using a zero-order stop (ZOS) which blocks much of this radiation. Region 620 corresponds to surface scattered radiation which travels in the same direction in X as the diffraction orders, but a different direction in Y. This radiation also causes a position (accuracy) but does not add coherently to the alignment signal. Therefore the alignment signal is less sensitive to the radiation scattered into region 620 than it is to radiation scattered into region 610, and the effect of this radiation can also be eliminated with a ZOS. As such, the main concern is surface scattering (from both residual topography and random roughness) into pupil region 610.

Referring back to FIG. 5, the effect of the surface topography, and more specifically the effect of surface scattering into region 610, on a measured position $X_m$, for each example, is shown below each corresponding Figure. In FIG. 5(a), the very small topography (2 pm) results in a significant and problematic alignment error of about 1 nm between the measured position $X_m$ and actual alignment mark position $X_g$, when using illumination radiation of 2000 nm wavelength. In FIG. 5(b), the larger topography of 20 nm (a magnitude in line with that observed in a production environment) results in the topography diffraction becoming dominant and the system effectively aligning on the topography rather than on the alignment mark. This can result in very large alignment errors, with an error of 99 nm being shown in the specific example of FIG. 5(b).

To address these issues, polarization filtering of the illumination radiation is proposed. It is therefore proposed to tune the combination of illumination polarization state, alignment mark design and/or detection polarization state so as to optimize transmission of the radiation scattered by the alignment mark while filtering out the radiation scattered by the surface topography.

This may be achieved by using polarization changing structures, more specifically polarization changing alignment marks ("polar alignment marks") which, in addition to diffracting the incoming radiation, also act to change the polarization state of the incoming radiation (the illumination polarization state). These polar alignment marks can be used to change the polarization state of the radiation scattered (diffracted) by the alignment mark (to a second polarization state) relative to that of the radiation scattered by the surface topography. More specifically, the polar alignment marks may change the polarization state of particular diffraction orders of the radiation scattered by the alignment mark, relative to the incident radiation. These particular diffraction orders may comprise the +1/−1 diffraction orders. These diffraction orders may also comprise some or all higher, corresponding odd-numbered orders (e.g., +3/−3, +5/−5 etc.). In this way, the radiation scattered by the surface topography, which will tend to retain a first polarization state (the illumination polarization state), can be filtered out using polarization filtering, for example by using a suitable optical filtering device which filters based on polarization state. The optical filtering device may comprise, for example, a polarizer which acts to substantially block radiation having the illumination polarization state or polarizing beam splitter which acts to separate radiation having the illumination polarization state from the scattered radiation. The optical filtering device may further comprise wave plate devices for changing the polarization angle to that more suitable for processing. A number of different embodiments will now be described.

Figure 7:
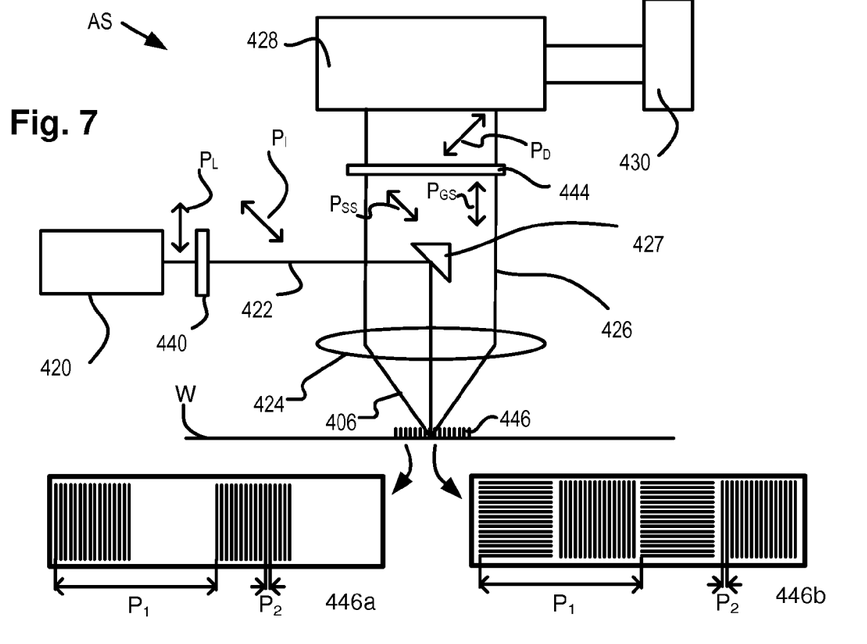
FIG. 7 illustrates schematically the optical system of a position sensor according to a first embodiment of the present invention.

FIG. 7 shows an alignment sensor AS arrangement according to a first embodiment. The main elements of the apparatus are as described in relation to FIG. 4 and will not be discussed further. What is of note is the polarization state of the radiation through the apparatus. In this specific embodiment, half-wave plate 440 changes the (horizontal) laser polarization state $P_L$ to an illumination (first) polarization state $P_I$, which here is a first diagonal polarization. Of course, if the laser were to output diagonal polarization, the half wave plate 440 would be omitted.

The illumination radiation 422 is scattered by a suitable polar alignment mark 446. The resultant scattered (e.g., diffracted) radiation 426 will comprise both the desired, grating scattered radiation from the grating structure of the polar alignment mark 446 and undesired, surface scattered radiation from the surface topography (more generally, radiation scattered from features other than the grating structure, which may include radiation scattered from: other features of the alignment mark and/or features of the substrate and/or features of the sensor optics/apparatus). The action of the polar alignment mark on the polarization state means that the grating scattered radiation will have a (second) grating scattered polarization state $P_{GS}$ relative to (first) illumination polarization state $P_I$. In the example shown, using alignment mark 446, the grating scattered polarization state $P_{GS}$ (e.g., of at least the +1/−1 diffraction orders) has been rotated 45 degrees to a vertical polarization state. However, grating scattered polarization state $P_{GS}$ may equally be a horizontal polarization state, or another polarization state (linear or otherwise) different from that of the illumination polarization state $P_I$. In reality, due to the imperfect nature of the polar alignment mark, grating scattered polarization state $P_{GS}$ will be more elliptical than the linear polarization state described.

Due to the nature of the (relatively shallow) surface topology, and assuming a near normal incidence for the illumination radiation, the surface scattered radiation will tend not to have any change in polarization state, such that the surface scattered polarization state $P_{SS}$ will be substantially similar to illumination polarization state $P_I$ (illustrated here as a first diagonal polarization).

The polarization filtering is achieved using (linear) polarizer 444 orientated to pass radiation having a second diagonal polarization (detection polarization state $P_D$), the second polarization state being orthogonal to said first diagonal polarization. As such, the illumination polarization state $P_I$ and the detection polarization state $P_D$ comprise mutually orthogonal linear polarization states. The polarizer 444 therefore substantially blocks all of the surface scattered radiation while passing some of the grating scattered radiation (a component thereof orientated with the detection polarization state $P_D$) for processing by processing system 428. It should be immediately apparent that the illustrated direction of the first and second diagonal states in the Figure is completely arbitrary and can be switched.

In an embodiment, the polar alignment mark may comprise a sub-segmented grating formed in one or more layers. Such a sub-segmented grating comprises a first grating pitch having an order of order magnitude similar to that of the wavelength of the illumination radiation, and therefore operable to diffract the illumination radiation. Each element of the grating may be further segmented with sub-structures having a sub-wavelength pitch smaller than the first grating pitch. This sub-wavelength pitch should be sufficiently small as not to diffract the illumination radiation; however it will cause the polarization state of the scattered radiation to be altered relative to the illumination radiation. Two examples of suitable polar alignment marks 446a, 446b are shown in the Figure. Both have a first diffraction grating pitch $P_1$ and a sub-wavelength pitch $P_2$. In the example of polar alignment mark 446a, only one of the "line" or "space" of the main grating pitch is sub-segmented. Note that the terms "line" and "space" are used as per grating convention and do not necessarily comprise literal lines and spaces, but (for example) regions of otherwise contrasting material. Greater efficiency can be achieved with a structure such as alignment mark 446b, where there are (orthogonal) sub-segmented lines (or other features) in each of the "lines" and "spaces" of the main diffraction grating pitch. In this manner, more illumination radiation will have its polarization state altered to a desired polarization state. More specifically, alignment mark 446b will tend to rotate the +1/−1 diffraction orders 90 degrees (rather than 45 degrees), relative to that of the illumination polarization state $P_I$, such that the grating scattered polarization state $P_{GS}$ comprises a second diagonal polarization state orthogonal to said first diagonal polarization state. This means that the grating scattered polarization state $P_{GS}$ is the same as the detection polarization state $P_D$ (see below) and therefore less of the actual alignment signal will be filtered out by polarizer 444.

A further advantage of the proposals described herein will be improved zero-order suppression. As already described, the zeroth diffraction order is partially blocked by spot mirror 427 and/or by a spatial filter (zero-order step), e.g., in or around a pupil plane of the system. However the size of such a physical zero-order stop is limited by the need to allow the +1/−1 diffraction orders to pass, particularly when measuring an alignment mark with relatively larger pitch (e.g., during coarse alignment). It can be appreciated that, while the polar alignment marks described change the polarization state of the odd higher diffraction orders (e.g., the desired alignment signal), they do not tend to change the zero-order radiation (nor other even diffraction orders). Therefore this zero-order radiation will also tend to retain the illumination polarization state and be filtered out by polarizer 444.

Figure 8:
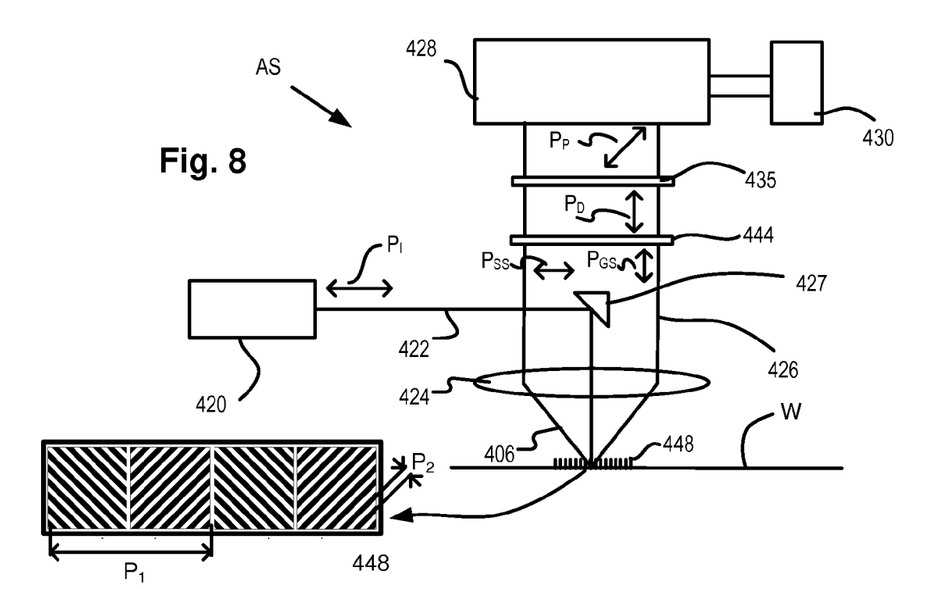
FIG. 8 illustrates schematically the optical system of a position sensor according to a second embodiment of the present invention.

FIG. 8 shows an alignment sensor AS arrangement according to a second embodiment. This embodiment is essentially very similar to that illustrated in FIG. 7, but with the polarization through the apparatus effectively rotated through 45 degrees. As in the first embodiment, the illumination polarization $P_I$ and detection polarization $P_D$ comprise opposite linear polarizations. However, in this example they are, respectively, horizontal and vertical. Of course, the illumination polarization $P_I$ and detection polarization $P_D$ may be switched to be, respectively, vertical and horizontal.

The alignment mark 448 in this embodiment is again a polar alignment mark. However, the sub-segmented features are now orientated diagonally relative to the main diffraction grating pitch (and illumination polarization). In a similar manner as already described, the polar alignment mark 448 changes the (second) grating scattered polarization state $P_{GS}$ of the grating scattered radiation (e.g., the +1/−1 and possibly other odd diffraction orders) relative to the (first) illumination polarization state $P_I$. The example illustrated shows an alignment mark 448 with opposite diagonal sub-segmentation per "line" and "space", which tends to rotate the polarization such that the grating scattered polarization state $P_{GS}$ is rotated 90 degrees to a vertical polarization state. Depending, for example, on the alignment mark used, the grating scattered polarization state $P_{GS}$ may be diagonal, or an altogether different polarization state to that illustrated, provided it is different to the illumination polarization state $P_I$. The surface scattered polarization state $P_{SS}$ will be substantially similar to illumination polarization state $P_I$, and therefore will be substantially blocked (filtered out) by polarizer 444 which is orientated vertically in this embodiment. Finally, the filtered radiation, having a (vertical) detection polarization state $P_D$, passes through half-wave plate 435 which rotates the polarization state to a polarization state $P_P$ more suitable for processing by a self-referencing interferometer (processing system 428).

In a variation, the half-wave plate 435 and polarizer 444 can be swapped, with the polarizer then rotated 45 degrees. Here, the half-wave plate will rotate both the grating scattered polarization state $P_{GS}$ and the surface scattered polarization state $P_{SS}$, with the diagonally orientated polarizer blocking the now orthogonally diagonally polarized surface scattered radiation. Many other variations will be apparent to the skilled person.

Figure 9:
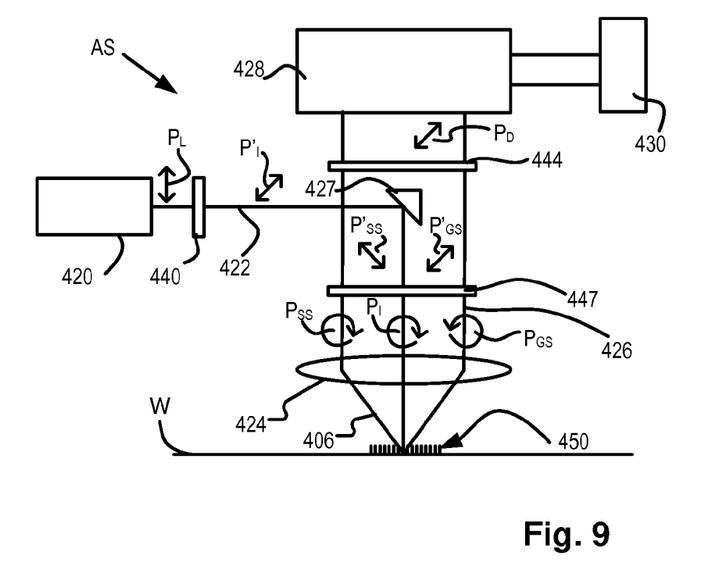
FIG. 9 illustrates schematically the optical system of a position sensor according to a third embodiment of the present invention.

FIG. 9 shows an alignment sensor AS arrangement according to a third embodiment. This arrangement uses a circular polarization state as the illumination polarization state $P_I$. Alignment mark 450 is configured to change the polarization state of the grating scattered radiation, such that the (second) grating scattered polarization state $P_{GS}$ (e.g., of at least the +1/−1 diffraction orders) is circular in the opposite direction (clockwise versus anticlockwise or vice versa) to that of the (first) illumination polarization state $P_I$. The alignment mark may, for example, be any suitable polar alignment mark, and comprise any of the alignment marks 446a, 446b, 448 already described.

While the skilled person will recognize that there are many different methods for generated circularly polarized illumination radiation (all of which are applicable here), in the specific arrangement illustrated, the vertical (or horizontal) laser polarization state $P_L$, is rotated 45 degrees by half-wave plate 440 to a diagonal polarization state $P'_I$. Quarter-wave plate 447 (orientated with its fast axis horizontal or vertical) then transforms this diagonal polarization state $P'_I$ to the illumination polarization state $P_I$.

As already mentioned, the direction of the grating scattered polarization state $P_{GS}$ is changed by the alignment mark 450 to be circular in the opposite direction. Therefore the grating scattered polarization state $P_{GS}$ and the (unchanged) surface scattered polarization state $P_{SS}$ have opposite circular polarization states. Note that, while the drawing appears (for clarity) to show the opposite diffraction orders each having different polarization states, each diffraction order will actually comprise both grating scattered radiation and surface scattered radiation. The scattered radiation 426 then passes again through quarter-wave plate 447, which transforms the radiation back to being (diagonally) linearly polarized. However, the surface scattered polarization state $P_{SS}$ and the grating scattered polarization state $P_{GS}$ will be transformed into mutually orthogonal linear polarization states $P'_{SS}$, $P'_{GS}$. A suitable polarizer 444 can then be used to reject the radiation having linear polarization state $P'_{SS}$ such that the radiation to be processed has detection polarization state $P_D$.

An alignment sensor which detects the illumination polarization state as well as the detection polarization state may have some advantages in view of backward compatibility (e.g., when using non-rotating alignment marks). This will require two detection branches with two processing systems etc. Alignment sensors having two detection branches are already known. These however do not measure illumination polarization and detection polarization, but rather two orthogonal polarization states, each of which has a 50% overlap with the illumination polarization state. It is therefore proposed to modify such an arrangement.

Figure 10:
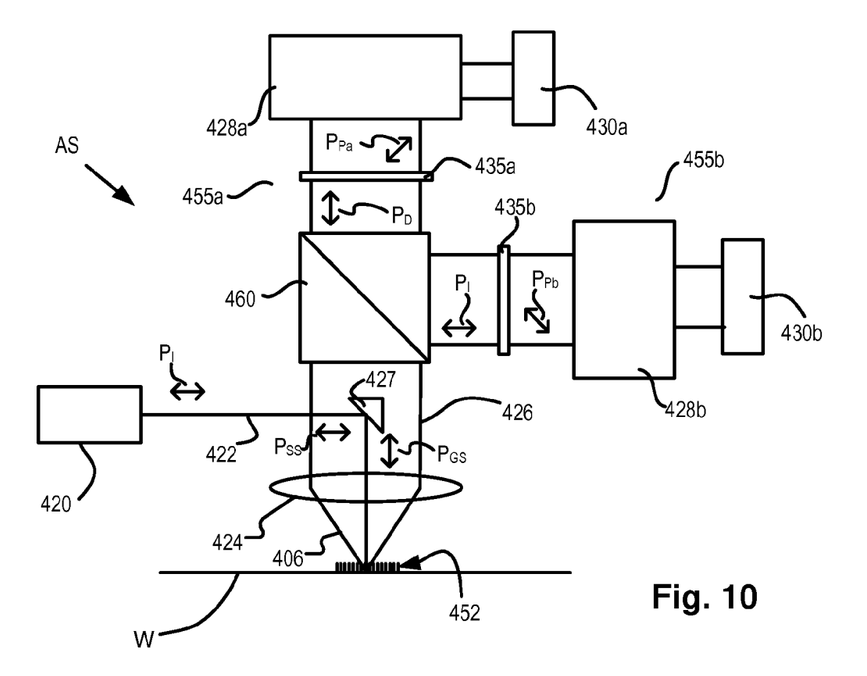
FIG. 10 illustrates schematically the optical system of a position sensor according to a fourth embodiment of the present invention.

As such, FIG. 10 shows an alignment sensor AS with two detection branches 455a, 455b; each comprising respective half-wave plates 435a, 435b, processing systems 428a, 428b and detection systems 430a, 430b. Polarizing beam splitter 460 separates the scattered radiation into the two detection branches 455a, 455b.

In the specific example of FIG. 10, the illumination polarization state $P_I$ is linear; more specifically horizontal. Therefore, the apparatus can be appreciated as being a dual detection branch variation of the second embodiment depicted in FIG. 8. As before, the illumination polarization state $P_I$ could equally be vertical. It should also be readily apparent that a dual detection branch variation of the first embodiment depicted in FIG. 7 is possible, e.g., by removing half-wave plates 435a, 435b and instead putting a half-wave plate into the input path 422. Alignment mark 452 may be inter alia any of the forms previously described, for example alignment mark 448. As before, therefore, there are many variations possible on the basic concept described.

In this embodiment, the first detection branch 455a operates in precisely the same manner as already described in relation to FIG. 8, with the polarizing beam splitter 460 (in place of polarizer 444) performing the polarizing filtering. As such, only the polarization state orthogonal to the illumination polarization state $P_I$, i.e., detection polarization state $P_D$, enters the first detection branch 455a. This is then rotated by half-wave plate 435a to polarization state $P_{Pa}$ for processing by processing system 428a. The second detection branch 455b acquires (via polarizing beam splitter 460) radiation with the illumination polarization state $P_I$ (e.g., the radiation filtered out from the first (main) processing branch). This is then rotated by half-wave plate 435b to polarization state $P_{Pb}$ for processing by processing system 428b.

Figure 11:
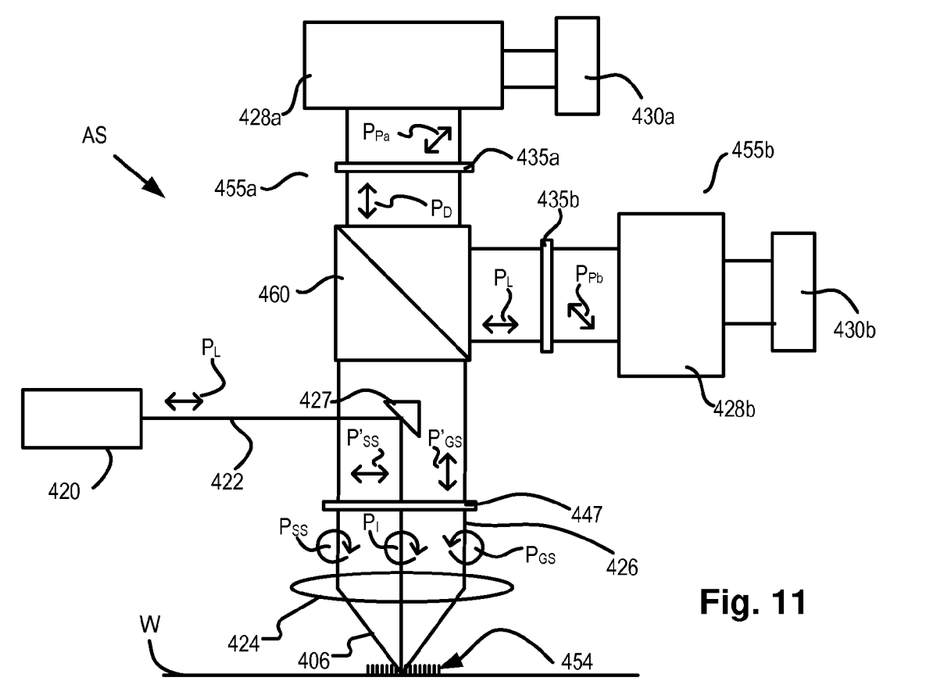
FIG. 11 illustrates schematically the optical system of a position sensor according to a fifth embodiment of the present invention.

FIG. 11 is a dual detection branch version of the circular polarization embodiment depicted in FIG. 9. However, for convenience the linear polarizations through the system (and therefore the quarter-wave plate 447) have been rotated through 45 degrees. Apart from this, the first detection branch 455a operates in essentially the same manner as already described in relation to FIG. 9, with the polarizing beam splitter 460 (in place of polarizer 444) performing the polarizing filtering. As such, only the polarization state $P'_{GS}$, transformed by quarter-wave plate 447 from the grating scattered radiation having circular polarized grating scattered polarization state $P_{GS}$, enters the first detection branch 455a. This is then rotated by half-wave plate 435a to polarization state $P_{Pa}$ for processing by processing system 428a. The second detection branch 455b acquires (via polarizing beam splitter 460) radiation with the laser polarization state $P_L$, having been transformed by quarter-wave plate 447 from the surface scattered radiation having (circularly polarized) surface scattered polarization state $P_{SS}$ which corresponds to illumination polarization state $P_I$. This is then rotated by half-wave plate 435b to polarization state $P_{Pb}$ for processing by processing system 428b. Alignment mark 454 may be inter alia any of the forms previously described, for example alignment mark 446b or 448.

As already mentioned, alignment may be performed in two phases: coarse alignment and fine alignment. These coarse alignment and fine alignment phases may be performed on different alignment marks and using different measurement radiation wavelengths; with coarse alignment using alignment marks of a larger pitch, and measurement radiation of a smaller wavelength, than that of fine alignment. In many applications, the coarse alignment marks are not formed on the substrate, but rather are located on the substrate stage. As such, these alignment marks are difficult to change and presently do not alter the polarization state. Also, these alignment marks will not have overlaying (opaque) layers and therefore surface scattering is not an issue in any case. Therefore, for coarse alignment, it may be beneficial not to employ polarization filtering as disclosed herein. This means that coarse alignment, and stage align, can be performed in the present manner using (current) non-polarization changing alignment marks on the transmission image sensor (TIS) plate. This simplifies coarse alignment, and means that a significant portion of the signal is not filtered out by the polarization filter.

It is therefore proposed, in an embodiment, to perform the polarization filtering for only a range of wavelengths corresponding to the radiation used in the fine alignment phase. To achieve this, it is proposed that the polarizing device which performs the actual polarization filtering, (e.g., the polarizer 444 in the above embodiments) be configured to polarize only the fine alignment measurement radiation, and not the coarse alignment measurement radiation. More specifically, the polarization device may be configured to transmit only one linearly polarized radiation state (i.e., the polarization direction corresponding to that of the grating scattered radiation) for radiation within the fine alignment measurement radiation wavelength range, and to transmit both (orthogonal) polarization directions for radiation within the coarse alignment measurement radiation wavelength range. Such a spectral polarizing device may be used with alignment marks comprising fine alignment marks which change the polarization state of the measurement radiation (e.g., the polar alignment marks described herein) and more conventional coarse alignment marks which do not affect the polarization state of the measurement radiation.

In an embodiment, such a spectral polarizing device may comprise a polarizing device with a suitable multilayer coating. By way of a specific example, the coarse measurement radiation may comprise a wavelength in the range 1500-1700 nm and the fine measurement radiation may comprise a wavelength in the range 1700-2000 nm. In such an embodiment, a spectral polarizing device may transmit radiation in only one linear direction (e.g., act as a polarizer) corresponding to the polarization state of the grating scattered radiation for (e.g.) 1800 nm radiation, while transmitting both directions at (e.g., 1600 nm).

It should be appreciated that, in any of the embodiments described above, where it is stated that a polarizing device substantially transmits radiation of a particular polarization state, this should be understood to be relative to a blocked polarization state, and it may be that there is some attenuation at that transmitted polarization state.

There are many possible implementations within the principles of the present disclosure other than those specifically described and illustrated. The principles of the present disclosure can be applied to other types of metrology sensors, not only alignment sensors, and metrology sensors with self-referencing interferometers, or interferometers more generally. The metrology marks may comprise alignment marks, or more generally other target types, depending on metrology application, and may differ from the form and principles shown. For example a metrology mark may be formed in more than one layer, for example for measuring overlay, for which the concepts described herein are also applicable. While the metrology mark is described as having a main structure which is periodic (e.g., a grating), it may instead comprise a non-periodic main structure. Of relevance is that the metrology mark changes the polarization state of one of the first portion of scattered radiation (e.g., grating scattered radiation) and the second portion of radiation (e.g., surface scattered radiation) relative to the other of the first portion of radiation and the second portion of radiation thereby enabling the portions to be subsequently separated based on their polarization state. While the embodiments above describe the metrology mark changing the polarization state of the first portion relative to the second portion, it may instead be operable to change the second portion relative to the first portion (e.g., where a non-normal incidence is used when measuring the alignment mark, such that the surface scattered radiation undergoes a change in polarization state) or to change both portions to different polarization states. The wavelength range(s) can be different to the examples given above. For future applications, extension of the sensing wavelengths into ultraviolet wavelengths may be considered, for example. The principles of the present disclosure can be used in combination with other techniques, including those introduced in the prior patents and patent applications mentioned in the introduction.

While specific embodiments of the invention have been described above, it will be appreciated that the invention may be practiced otherwise than as described.

While the example structures described above as metrology marks are grating structures specifically designed and formed for the purposes of position measurement, in other embodiments, positions may be measured on structures which are functional parts of devices formed on the substrate. Many devices have regular, grating-like structures. The terms "mark" and "grating structure" as used herein do not require that the structure has been provided specifically for the measurement being performed. An opaque layer is not the only kind of overlying structure that may disrupt measurement of the position of the mark by observing the mark in conventional wavelengths. For example, surface roughness, or a conflicting periodic structure, may interfere with measurement at one or more wavelengths.

In association with the position measuring hardware and suitable structures realized on substrates and patterning devices, an embodiment may include a computer program containing one or more sequences of machine-readable instructions implementing methods of measurement of the type illustrated above to obtain information about the position of the mark covered by an overlying structure. This computer program may be executed, for example, by a processor 606 or the like which is dedicated to that purpose, or is integrated in the control unit LACU of FIG. 1. There may also be provided a data storage medium (e.g., semiconductor memory, magnetic or optical disk) having such a computer program stored therein.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 1-100 nm), as well as particle beams, such as ion beams or electron beams.

The term "lens", where the context allows, may refer to any one or combination of various types of optical components, including refractive, reflective, magnetic, electromagnetic and electrostatic optical components. Reflective components are likely to be used in an apparatus operating in the UV and/or EUV ranges.

The breadth and scope of the present invention should not be limited by any of the above-described exemplary embodiments, but should be defined only in accordance with the following claims and their equivalents.

The invention claimed is:

1. A metrology sensor apparatus comprising:
    an illumination system operable to illuminate a metrology mark on a substrate with illumination radiation having a first polarization state;
    an optical collection system configured to collect scattered radiation, following scattering of the illumination radiation by the metrology mark, the metrology mark comprising a main structure and being operable to change, relative to the first polarization state, at least one of a polarization state of a first portion of the scattered radiation predominately resultant from scattering by the main structure and a polarization state of a second portion of radiation predominately resultant from scattering by one or more features other than the main structure, such that the polarization state of the first portion of the scattered radiation is different to the polarization state of the second portion of the scattered radiation; and
    an optical filtering system operable to substantially filter out the second portion of the scattered radiation based on its polarization state;
    wherein the one or more features include at least one of an opaque layer that blocks visible or near-infra-red radiation, surface topography, and a conflicting periodic structure.

2. The metrology sensor apparatus of claim 1, wherein the second portion of the scattered radiation predominately comprises radiation having been scattered by at least two layers formed over the main structure.

3. The metrology sensor apparatus of claim 1, wherein the optical filtering system comprises at least a polarizing device operable to block the second portion of the scattered radiation based on its polarization state.

4. The metrology sensor apparatus of claim 3, further comprising:
    a first processing branch and a second processing branch, each for processing the scattered radiation, and
    wherein the polarizing device comprises a polarizing beam splitter operable to direct at least some of the first portion of scattered radiation to the first processing branch and to direct the second portion of the scattered radiation to the second processing branch.

5. The metrology sensor apparatus of claim 1, wherein the optical filtering system further comprises at least one wave plate device operable to rotate the polarization state of at least some of the first portion of scattered radiation to a polarization state more suitable for processing.

6. The metrology sensor apparatus of claim 1, wherein the metrology mark is operable to change the polarization state of the first portion of the scattered radiation to a second polarization state, while not changing the polarization state of the second portion of the scattered radiation, such that the second portion of the scattered radiation substantially retains the first polarization state.

7. The metrology sensor apparatus of claim 6, wherein the main structure comprises a periodic structure having a first pitch operable to diffract the illumination radiation, the periodic structure being sub-segmented with a second pitch operable to change the polarization state of the first portion of the scattered radiation.

8. The metrology sensor apparatus of claim 6, wherein the first polarization state is a first circular polarization state and the second polarization state is a second circular polarization state, the second circular polarization state being in the opposite direction as the first circular polarization state.

9. The metrology sensor apparatus of claim 8, wherein the optical filtering system comprises at least one quarter-wave plate for converting both the first portion of scattered radiation having the first circular polarization state and the second portion of scattered radiation having the second circular polarization state into mutually orthogonal linear polarization states, enabling their separation.

10. The metrology sensor apparatus of claim 1, wherein the first polarization state is a linear polarization state.

11. The metrology sensor apparatus of claim 10, wherein the optical filtering system is operable to pass only scattered radiation having a polarization state orthogonal to the first polarization state to a processing system.

12. The metrology sensor apparatus of claim 10, wherein the metrology mark is operable to change the polarization state of the first portion of the scattered radiation to a second polarization state, the second polarization state being orthogonal to the first polarization state.

13. The metrology sensor apparatus of claim 1, wherein the optical filtering system is operable to:
   substantially not filter out the second portion of the scattered radiation in a first wavelength range at least partially corresponding to an illumination wavelength range used in a first positioning phase; and
   filter out the second portion of the scattered radiation in a second wavelength range at least partially corresponding to an illumination wavelength range used in a second positioning phase.

14. The metrology sensor apparatus of claim 13, wherein:
   the first positioning phase is a coarse positioning phase performed on a first metrology mark;
   the second positioning phase is a fine positioning phase performed on a second metrology mark; and
   only the second metrology mark is operable to perform the change of polarization state.

15. A method of measuring a metrology mark, comprising:
   illuminating a metrology mark on a substrate with illumination radiation having a first polarization state;
   collecting scattered radiation, following scattering of the illumination radiation by the metrology mark, the metrology mark comprising a main structure and being operable to change, relative to the first polarization state, at least one of a polarization state of a first portion of the scattered radiation predominately resultant from scattering by the main structure and a polarization state of a second portion of radiation predominately resultant from scattering by one or more features other than the main structure, such that the polarization state of the first portion of the scattered radiation is different to the polarization state of the second portion of the scattered radiation; and
   filtering out the second portion of the scattered radiation based on its polarization state;
   wherein the one or more features include at least one of an opaque layer that blocks visible or near-infra-red radiation, surface topography, and a conflicting periodic structure.

16. The method of claim 15, wherein the second portion of the scattered radiation predominately comprises radiation having been scattered by at least from one or more layers formed over the main structure.

17. The method of claim 15, comprising using a polarizing beam splitter to perform the filtering; and processing at least some of the first portion of scattered radiation separately to processing of the second portion of scattered radiation.

18. A method of manufacturing devices wherein a device pattern is applied to a substrate using a lithographic process, the method including positioning the applied pattern by reference to measured positions of one or more metrology marks formed on the substrate, the measured positions being obtained using a metrology sensor system comprising:
   an illumination system operable to illuminate a metrology mark on a substrate with illumination radiation having a first polarization state;
   an optical collection system configured to collect scattered radiation, following scattering of the illumination radiation by the metrology mark, the metrology mark comprising a main structure and being operable to change, relative to the first polarization state, at least one of a polarization state of a first portion of the scattered radiation predominately resultant from scattering by the main structure and a polarization state of a second portion of radiation predominately resultant from scattering by one or more features other than the main structure, such that the polarization state of the first portion of the scattered radiation is different to the polarization state of the second portion of the scattered radiation; and
   an optical filtering system operable to substantially filter out the second portion of the scattered radiation based on its polarization state;
   wherein the one or more features include at least one of an opaque layer that blocks visible or near-infra-red radiation, surface topography, and a conflicting periodic structure.

19. A lithographic apparatus for use in applying a pattern to a substrate, the lithographic apparatus including a metrology sensor system comprising:
   an illumination system operable to illuminate a metrology mark on a substrate with illumination radiation having a first polarization state;
   an optical collection system configured to collect scattered radiation, following scattering of the illumination radiation by the metrology mark, the metrology mark comprising a main structure and being operable to change, relative to the first polarization state, at least one of a polarization state of a first portion of the scattered radiation predominately resultant from scattering by the main structure and a polarization state of a second portion of radiation predominately resultant from scattering by one or more features other than the main structure, such that the polarization state of the first portion of the scattered radiation is different to the polarization state of the second portion of the scattered radiation; and
   an optical filtering system operable to substantially filter out the second portion of the scattered radiation based on its polarization state;
   wherein the one or more features include at least one of an opaque layer that blocks visible or near-infra-red radiation, surface topography, and a conflicting periodic structure.

* * * * *